(12) United States Patent
Hong et al.

(10) Patent No.: US 11,027,275 B2
(45) Date of Patent: Jun. 8, 2021

(54) METHOD FOR FABRICATING MICROFLUIDIC STRUCTURES

(71) Applicant: NATIONAL TSING HUA UNIVERSITY, Hsinchu (TW)

(72) Inventors: Chien-Chong Hong, Hsinchu (TW); Shih-Hong You, New Taipei (TW); Wen Chung, Kaohsiung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 16/748,812

(22) Filed: Jan. 22, 2020

(65) Prior Publication Data

US 2020/0156064 A1 May 21, 2020

Related U.S. Application Data

(62) Division of application No. 15/582,750, filed on Apr. 30, 2017, now Pat. No. 10,576,469, which is a (Continued)

(30) Foreign Application Priority Data

Jan. 21, 2014 (TW) .................................. 103102130

(51) Int. Cl.
*B01L 3/00* (2006.01)
*B32B 37/00* (2006.01)
(Continued)

(52) U.S. Cl.
CPC ........ *B01L 3/502707* (2013.01); *B32B 37/12* (2013.01); *B32B 37/18* (2013.01); *B32B 38/0004* (2013.01); *B32B 38/10* (2013.01); *B81C 99/0095* (2013.01); *B01L 2200/12* (2013.01); *B01L 2300/0816* (2013.01); *B01L 2300/0887* (2013.01); *B01L 2300/123* (2013.01); *B81B 2201/058* (2013.01); *Y10T 29/49895* (2015.01); *Y10T 156/1051* (2015.01); *Y10T 156/1064* (2015.01); *Y10T 156/1082* (2015.01)

(58) Field of Classification Search
None
See application file for complete search history.

(56) References Cited

U.S. PATENT DOCUMENTS 7,514,045 B2 * 4/2009 Corcoran .......... B01L 3/502707
                                                                                                   264/284
8,808,489 B2 * 8/2014 Taylor ................ B32B 38/0004
                                                                                                   156/257
(Continued)

*Primary Examiner* — Linda L Gray
(74) *Attorney, Agent, or Firm* — CKC & Partners Co., LLC

(57) ABSTRACT

A method for fabricating microfluidic structures is provided. The method includes: a belt is provided and an adhesion layer is formed on at least one surface of the belt; the belt is cut for forming a first microfluidic channel thereon, wherein the first microfluidic channel has an accommodating space; a second microfluidic channel is provided, wherein a line-width of the second microfluidic channel is smaller than a line-width of the first microfluidic channel; the second microfluidic channel is disposed in the accommodating space of the first microfluidic channel; and a substrate is adhered to the belt via the adhesion layer.

3 Claims, 11 Drawing Sheets

Related U.S. Application Data division of application No. 14/266,820, filed on Apr. 30, 2014, now Pat. No. 9,682,374.

(51) Int. Cl.
  *B32B 38/00* (2006.01)
  *B81C 99/00* (2010.01)
  *B32B 37/18* (2006.01)
  *B32B 37/12* (2006.01)
  *B32B 38/10* (2006.01)

(56) References Cited

U.S. PATENT DOCUMENTS

2010/0116429 A1* 5/2010 Berkey ................ B01J 19/0093
  156/249
2013/0266979 A1* 10/2013 Segerink .......... G01N 33/48707
  435/29
2015/0093303 A1* 4/2015 Tsai ........................ B32B 37/30
  422/503

* cited by examiner

METHOD FOR FABRICATING MICROFLUIDIC STRUCTURES

RELATED APPLICATIONS

The present application is a Divisional Application of the U.S. application Ser. No. 15/582,750, filed Apr. 30, 2017, which is a Divisional Application of the U.S. application Ser. No. 14/266,820, filed on Apr. 30, 2014, U.S. Pat. No. 9,682,374 issued on Jun. 20, 2017, and claims priority to Taiwan application serial number 103102130, filed Jan. 21, 2014, the entire contents of which are hereby incorporated herein by reference.

BACKGROUND

Technical Field

The present disclosure relates to a method for fabricating microfluidic structures, especially relates to a method for fabricating microfluidic structures that patterns of the microfluidic structure are formed by utilizing pre-patterned double-sided tape, thereby extra packaging process is not required.

Description of Related Art

There exists a plurality of small-scaled materials in a natural world. For testing and researching these materials, small components having dimensions as low as µm or nm order are required. Conventionally, it is very difficult to fabricate devices equipped with such small-scaled components. Recently, as the progress on the science and the manufacturing technology, it is possible to fabricate devices equipped with such small-scaled components.

Microfluidic devices are widely used in biomedical equipment, fuel cells, heat exchangers, chromatography sensors and printer heads. Briefly speaking, the microfluidic structures are provided for a fluid to flow therein in order to transport or filter micro-materials in the fluid. In some cases, multi fluids are mixed in a microfluidic structure for observing reactions between many micro-materials, and achieving rapid transportation and testing. Recently, the microfluidic structures are widely used in biomedicine fields, for example, to utilize microfluidic structure to test or filter proteins or stem cells.

The fluid is not easily flowed in a microfluidic structure owing to the ultra-small dimension of the microfluidic structure. In a situation that without applying any outer driving forces, the fluid can only be driven by diffusion or capillarity effect. To the micro-materials with low diffusion coefficient (e.g. proteins), it will take a lot of time on flowing and mixing it to another micro-materials.

For solving issues on low fluidity of the fluids in microfluidic structures, many methods are provided for increasing diffusion rate of the fluids. In one method, the microfluidic structure are patterned to form complicated structures in order to increase contact area, thereby decreasing the diffusion length thus the diffusion rate can be increased. The aforementioned patterned microfluidic structure can also be applied extra driving forces such as voltage, electric field, pressure or micro-pump for driving the fluid.

Although the aforementioned patterned microfluidic structures can solve issues on low fluidity of the fluid, however, the original dimension of the microfluidic structure itself is very small. If complicated patterns are formed on the microfluidic structures, complicated processes are required, thereby leading to high manufacturing cost and time.

For example, FIG. 1 is a schematic view showing a conventional fabricating process for a microfluidic structure. In FIG. 1, a photo-sensitive material 120 is deposited on a substrate 110. Then, a photolithography process is applied to the photo-sensitive material 120 to form patterns for the microfluidic structure. Then, a metal layer 130 is deposited on the patterned photo-sensitive material 120, and an etching process is performed to remove the photo-sensitive material 120. The metal layer 130 is then patterned and formed on the substrate 110. The structure of the substrate 110 having the patterned metal layer 130 deposited thereon is called a master mold. After the master mold is formed, a gel-type material 140 which being solidified after heating is injected into the master mold, and the gel-type material 140 is patterned by the patterned metal layer 130. Finally, a patterned microfluidic structure is formed. Followed by cutting and bonding processes, a complete microfluidic device 150 is fabricated.

The aforementioned section discloses a conventional fabricating method for microfluidic structures. Although other fabricating methods are developed, the basic concept is similar with the aforementioned case. These kinds of processes are very complicated and related materials and equipment thereof are expensive as well as the fabricating time is long.

SUMMARY

According to one aspect of the present disclosure, a method for fabricating microfluidic structures includes: a belt is provided and an adhesion layer is formed on at least one surface of the belt; the belt is cut for forming a first microfluidic channel thereon, wherein the first microfluidic channel has an accommodating space; a second microfluidic channel is provided, wherein a line-width of the second microfluidic channel is smaller than a line-width of the first microfluidic channel; the second microfluidic channel is disposed in the accommodating space of the first microfluidic channel; and a substrate is adhered to the belt via the adhesion layer.

According to another aspect of the present disclosure, a method for fabricating microfluidic structures includes: a first belt is provided and an adhesion layer on at least one surface of the first belt; the first belt is cut for forming a first microfluidic channel, wherein the first microfluidic channel has a first depth; a second belt is provided and an adhesion layer is formed on at least one surface of the second belt; the second belt is cut for forming a second microfluidic channel, wherein the second microfluidic channel has a second depth; the firs belt and the second belt is adhered via the adhesion layer; and the first belt and the second belt are stacked in order to stack the first depth and the second depth.

According to still another aspect of the present disclosure, a method for fabricating microfluidic structures includes: a double-sided tape is provided, wherein the double-sided tape has an adhesion layer and at least one protecting layer outside of the adhesion layer, and the adhesion layer has at least one adhering surface; patterned-microfluidic channels is formed on the adhesion layer via a knife mold with pre-determined patterns; the protecting layer is removed for exposing the adhering surface; and a substrate is adhered to the adhering surface.

According to further another aspect of the present disclosure, a method for fabricating microfluidic structures includes: a double-sided tape is provided, wherein the double-sided tape has an intermediate layer, two adhesion layers located at a top side and a bottom side of the intermediate layer and two protecting layers located at outside of each adhesion layer, wherein each adhesion layer has at least one adhering surface; patterned-microfluidic channels are formed on the intermediate layer via a knife mold with pre-determined patterns; the protecting layer is removed for exposing the adhering surface and a substrate is adhered to the adhering surface.

According to one aspect of the present disclosure, a method for fabricating microfluidic structures includes: a belt is provided; the belt is cut via a knife mold with pre-determined patterns, a first microfluidic channel and an aligning area are formed on one portion of the belt, and an aligning mark is formed on the other portion of the belt, wherein the aligning area has an indentation; and the belt is folded for stacking the two portions thereof and the aligning mark is embedded to the indentation.

According to one aspect of the present disclosure, a method for fabricating microfluidic structures includes: a belt is provided; the belt is cut via a knife mold with pre-determined patterns, the belt is separated into tow portions by a folding line, a first microfluidic channel and an aligning area are formed on one portion of the belt, and an aligning mark is formed on the other portion of the belt, wherein the aligning area has an indentation; and the belt is folded for stacking the two portions thereof and the aligning mark is embedded to the indentation in accordance with the folding line.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
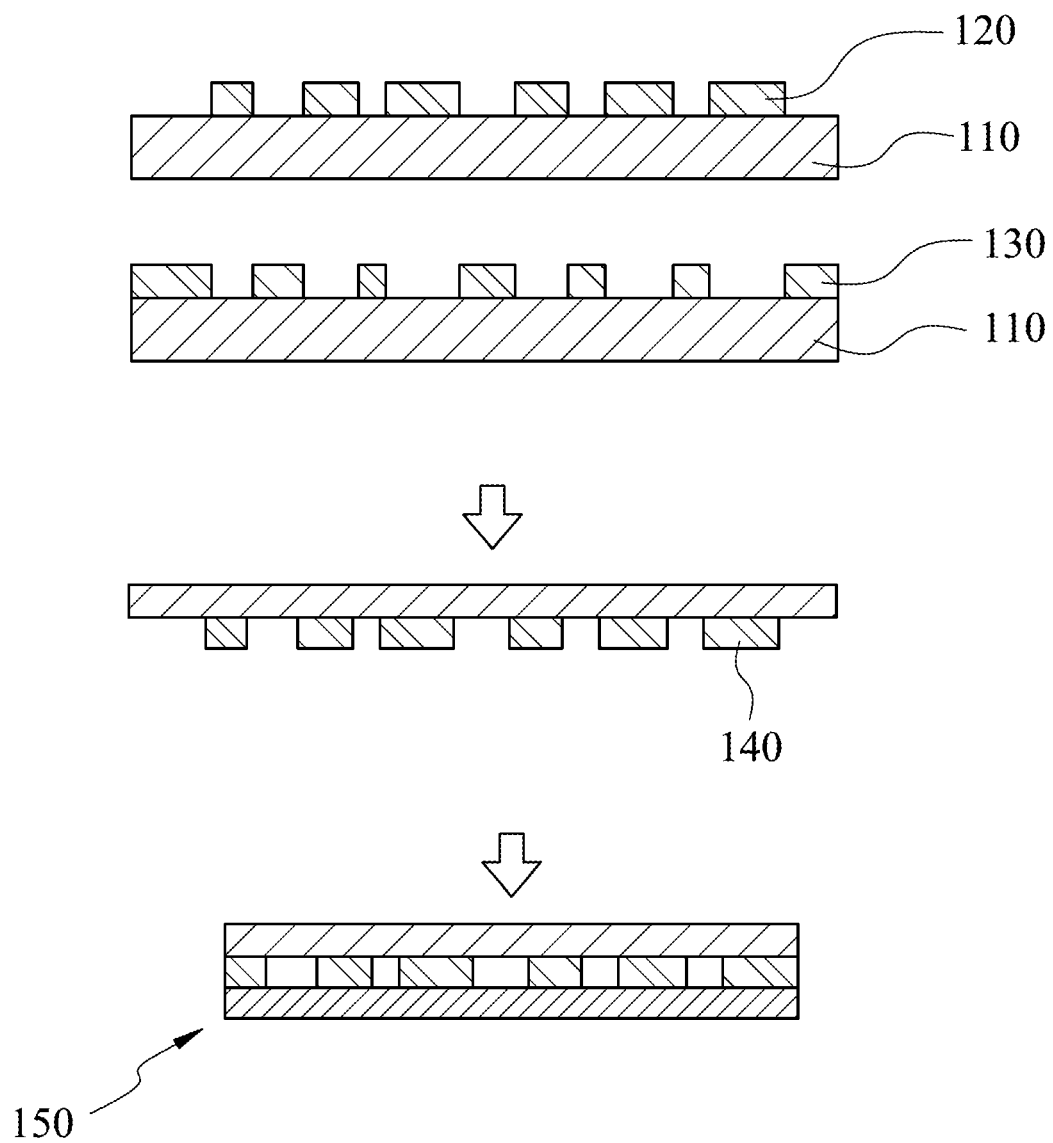
FIG. 1 is a schematic view showing a conventional fabricating process for a microfluidic structure.

Reference will now be made in detail to the present embodiments of the disclosure, examples of which are illustrated in the accompanying drawings. Wherever possible, the same reference numbers are used in the drawings and the description to refer to the same or like parts.

The present disclosure provides a method for fabricating microfluidic structures. Cutting a belt (e.g. single-sided tape or double-sided tape) with adhesion layer thereon, and forming microfluidic structure on the belt. By the adhesion layer of the belt, the microfluidic structure can be adhered to a substrate directly, thus a complete and useful microfluidic device is rapidly formed.

Figure 2:
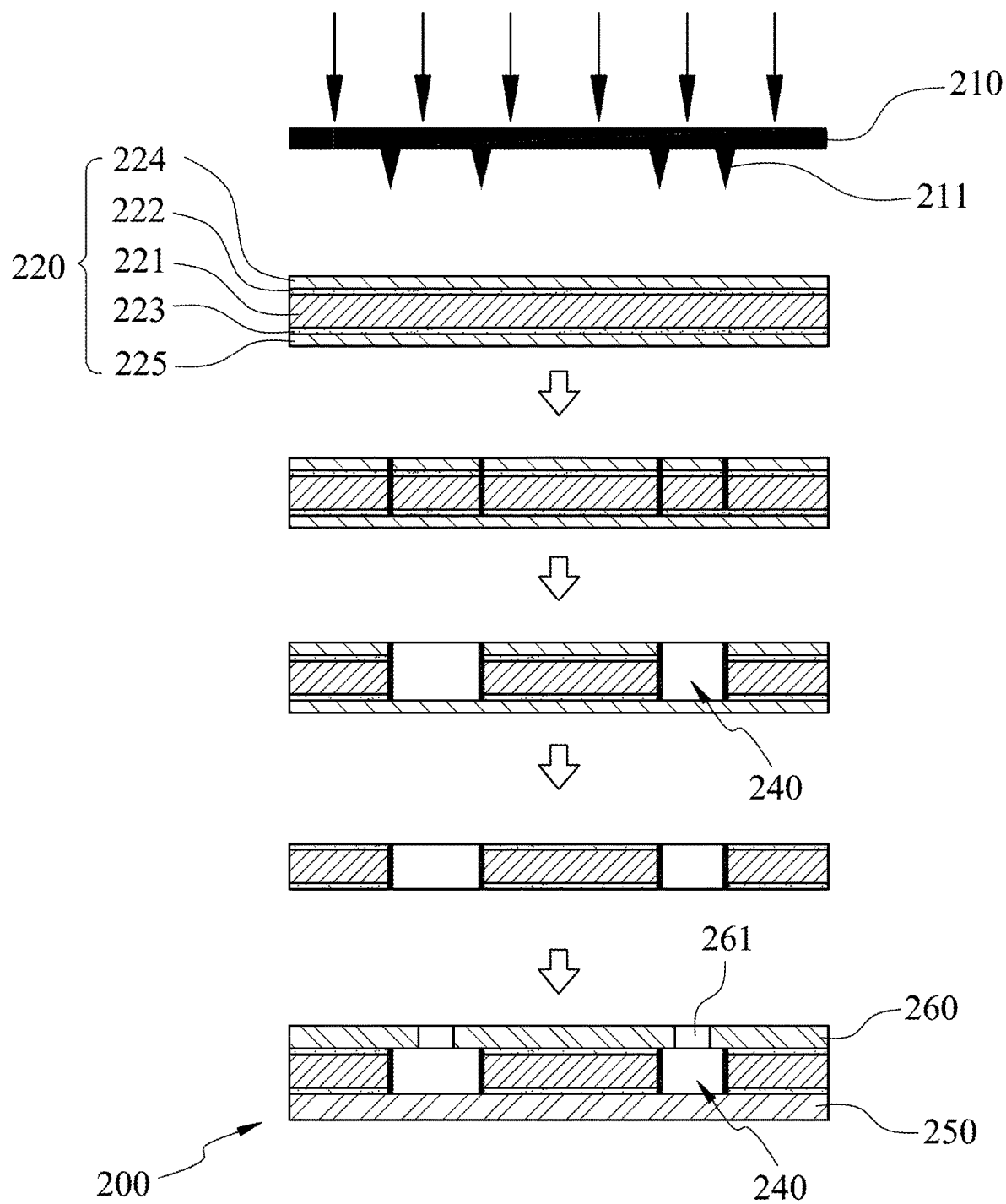
FIG. 2 is a schematic view showing a method for fabricating microfluidic structures according to one embodiment of the present disclosure.
Figure 3:
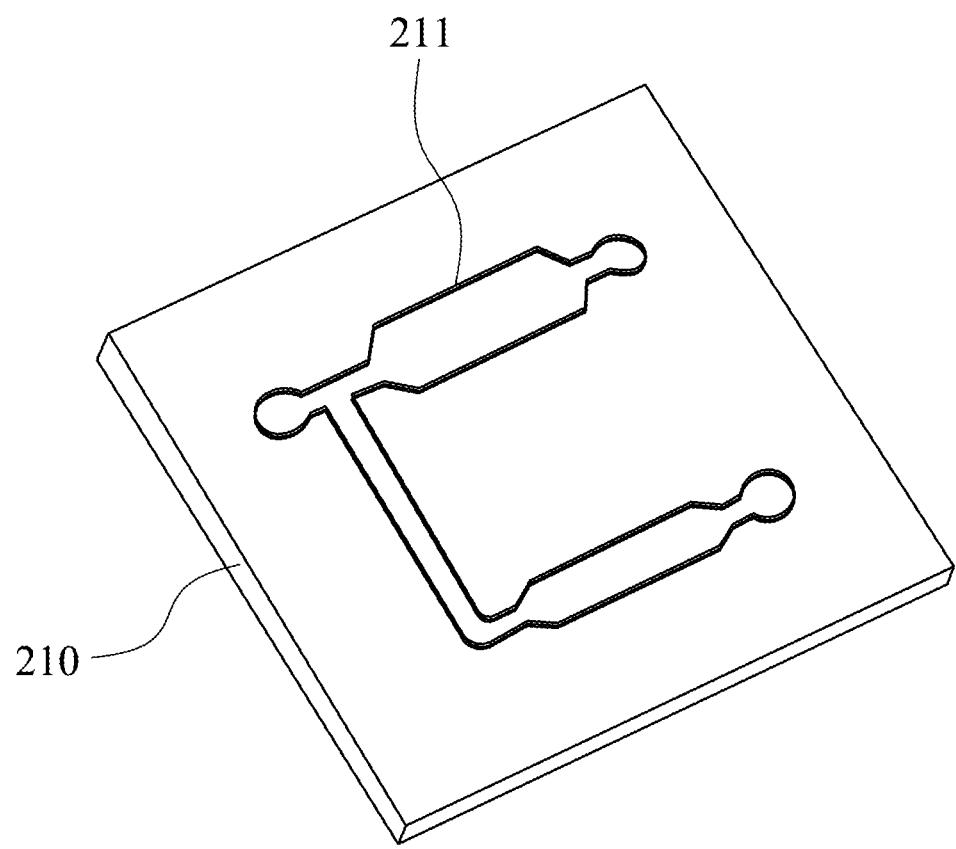
FIG. 3 is a structural view showing a knife mold used in the method of FIG. 2.

FIG. 2 is a schematic view showing a method for fabricating microfluidic structure 200 according to one embodiment of the present disclosure. FIG. 3 is a structural view showing a knife mold 210 used in the method of FIG. 2. Knife mold 210 is utilized for cutting a belt 220. A pre-patterned knife 211 is formed on the knife mold 210. In the embodiment, the belt 220 is a double-sided tape. The belt 220 includes adhesion layers 222, 223, intermediate layer 221 and protection layers 224, 225. The adhesion layers 222, 223 are formed on a top side and a bottom side of the intermediate layer 221 respectively. The protection layer 224 is formed on a top side of the adhesion layer 222 and the protection layer 225 is formed on a bottom side of the adhesion layer 223 for temporary protection. First, the belt 220 is cut by the knife 211. The protection layers 224, 225, the intermediate layer 221 and the adhesion layers 222, 223 are cut through. Owing to the knife 211 has pre-determined patterns, microfluidic channels 240 with pre-determined patterns are formed on a portion of the belt 220 that being cut through by the knife 211. Each of the adhesion layers 222, 223 has at least one adhesion surface (not shown). After removing the protection layers 224, 225, the adhesion surface of the adhesion layer 222 or 223 is exposed, and a substrate 250 can be adhered to the belt 220 having microfluidic channels 240. In detail, when one of the adhesion layers 222 or 223 has been adhered to the substrate 250, the other adhesion layer can be used to be adhered to another substrate 260. A plurality of holes 261 are formed on the substrate 260 for injecting a fluid into the microfluidic channels 240.

The belt 220 can have various structures. For example, the intermediate layer 221 of the belt 220 can be removed, thus the belt 220 can only have one adhesion layer 222. At the time, a patterned microfluidic channel 240 can be formed by cutting through the adhesion layer 222 by the knife 211.

Figure 4:
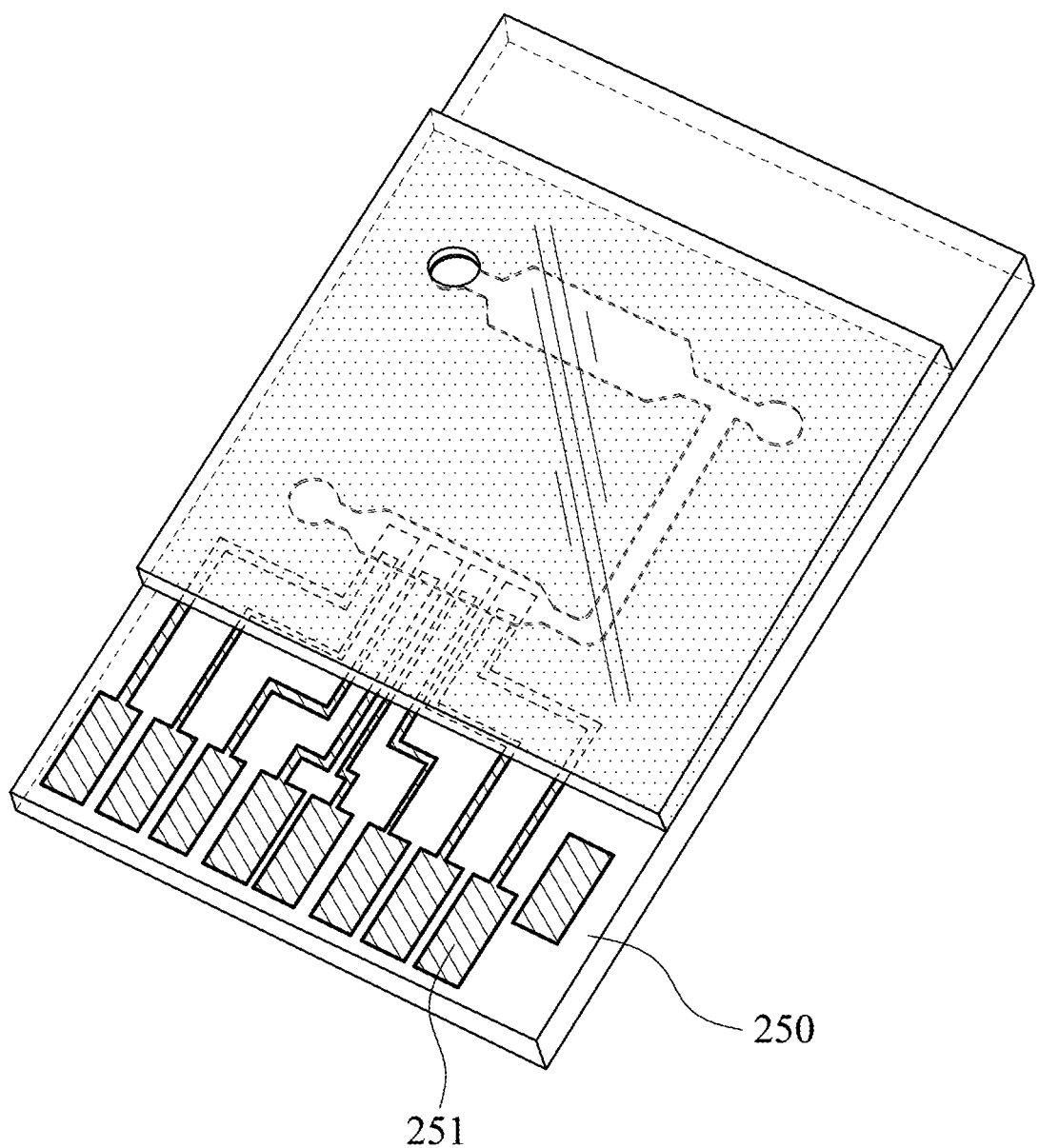
FIG. 4 is a structural view showing a complete product fabricated by the method of FIG. 2.

FIG. 4 is a structural view showing a complete product fabricated by the fabricating method of FIG. 2. In FIG. 4, reaction electrode 251 is disposed on the substrate 250. The reaction electrode 251 can be connected to an outer device in order to perform testing and analysis. The microfluidic structure 200 made by the method of the present disclosure is successfully applied on analyzing proteins and stem cells on the blood of human, and the analyzing results went well.

Figure 5:
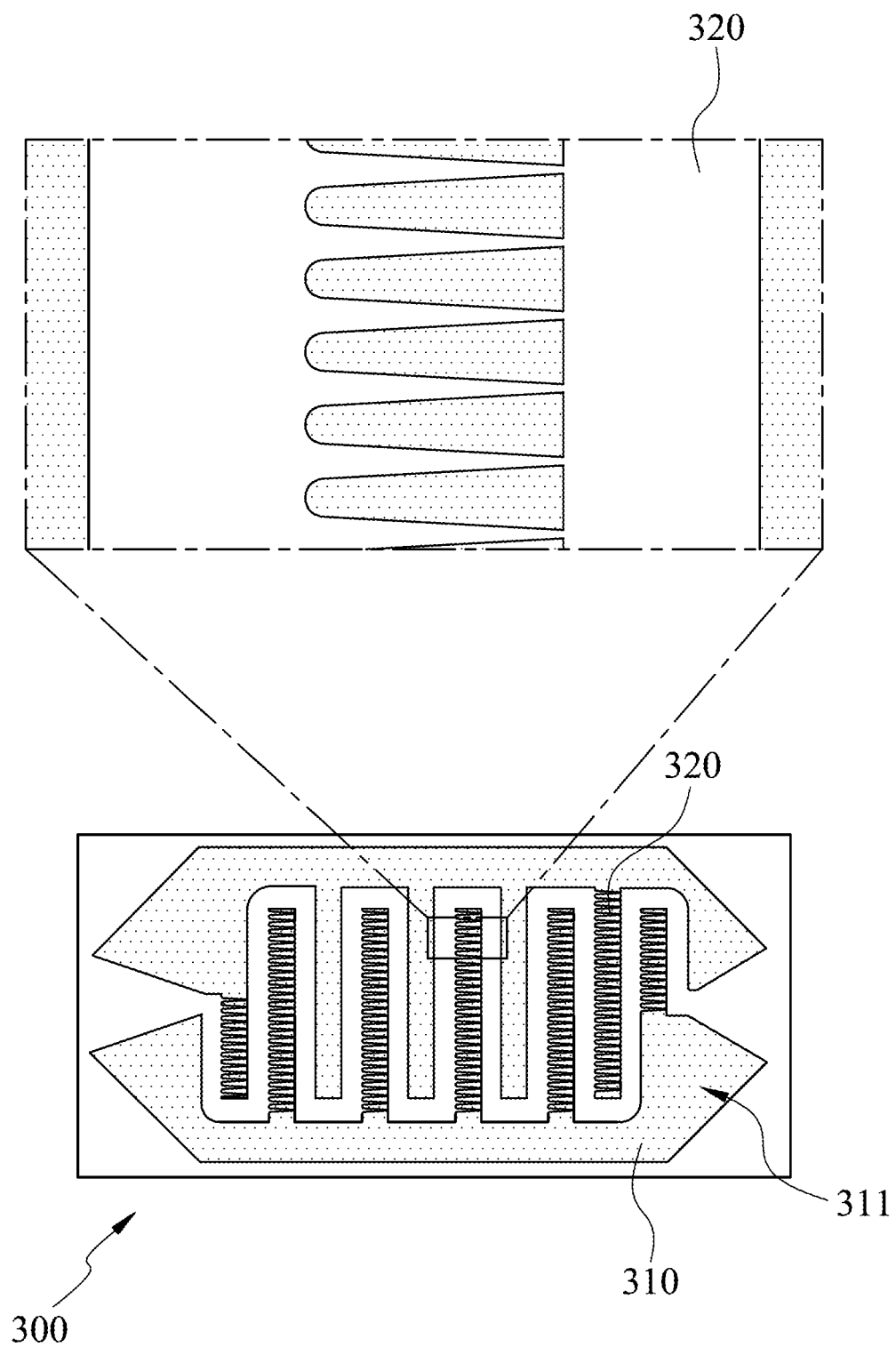
FIG. 5 is a schematic view showing another embodiment of the method of FIG. 2.

FIG. 5 is a schematic view showing another embodiment of the method of FIG. 2. In the microfluidic structure 200 of FIG. 2, the micro fluidic channel 240 is formed by cutting the belt 220 via the knife mold 210. Owing to the progress on the manufacturing technology, a width of the knife 211 of the knife mold 210 can be lower than 1 mm, and it is sufficient to meet requirements of biomedical applications. However, for extending the application field of the microfluidic structure 200, to achieve lower line-width of the microfluidic channel 240 is necessary. In FIG. 5, a microfluidic structure 300 with ultra-small line-width is showed. The microfluidic structure 300 includes a first microfluidic channel 310 with larger line-width and a second microfluidic channel 320 with smaller line-width.

The method for fabricating the first microfluidic channel 310 is the same as that of the microfluidic channel 240.

After fabricating the microfluidic channel 310, an accommodating space 311 is formed thereon. The second microfluidic channel 320 is formed in the accommodating space 311 by a photolithography process or a screen printing process. Finally, the microfluidic structure 300 is formed by adhering a substrate (not shown) to the first microfluidic channel 310. Owing to the second microfluidic channel 320 is formed by a photolithography process or a screen printing process, a line-width thereof can be achieved to µm order. Therefore, issue on insufficient resolution for the microfluidic channel 240 of the microfluidic structure 200 in FIG. 2 can be solved.

Figure 6A:
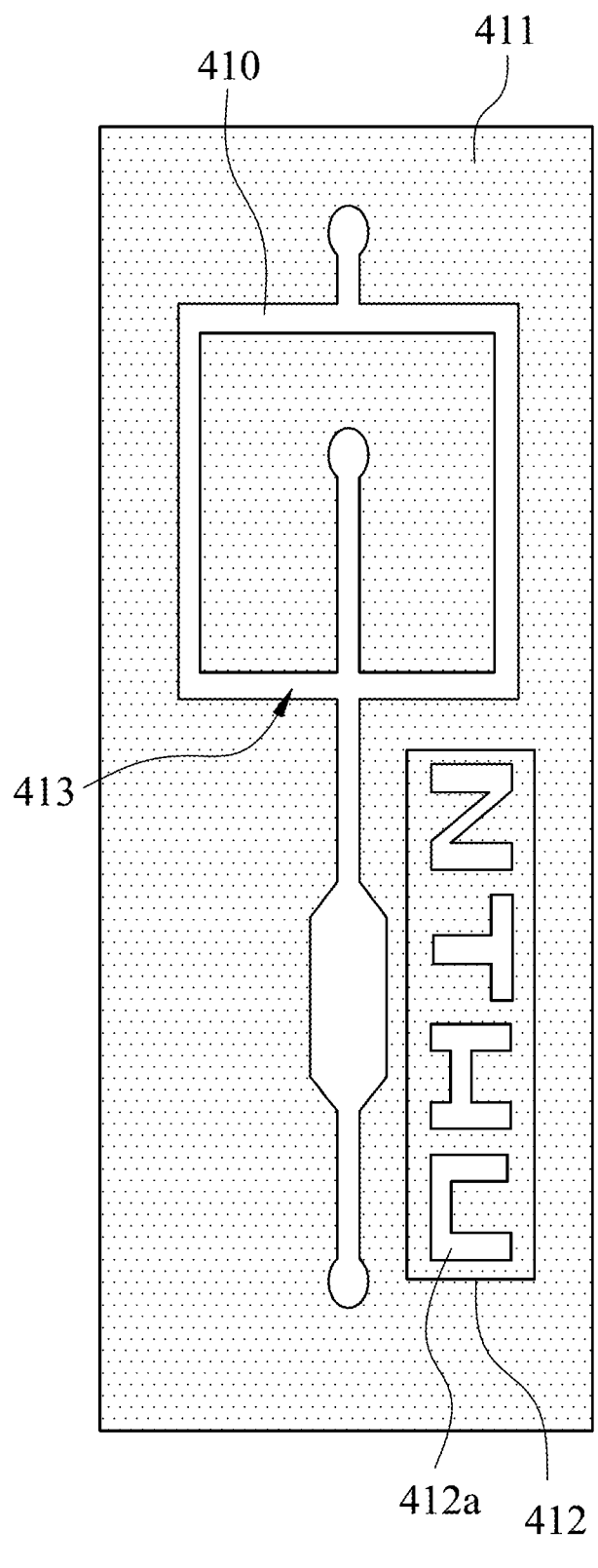
FIG. 6A to FIG. 6C are schematic views showing a method for fabricating microfluidic structures according to another embodiment of the present disclosure.
Figure 6B:
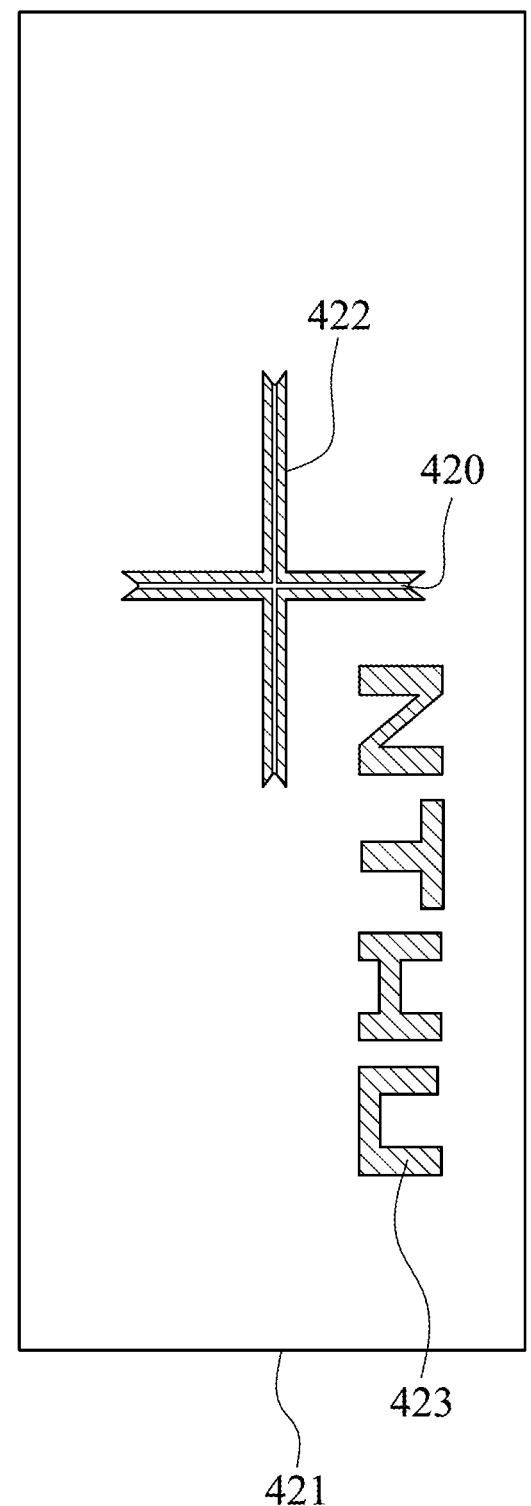
Figure 6C:
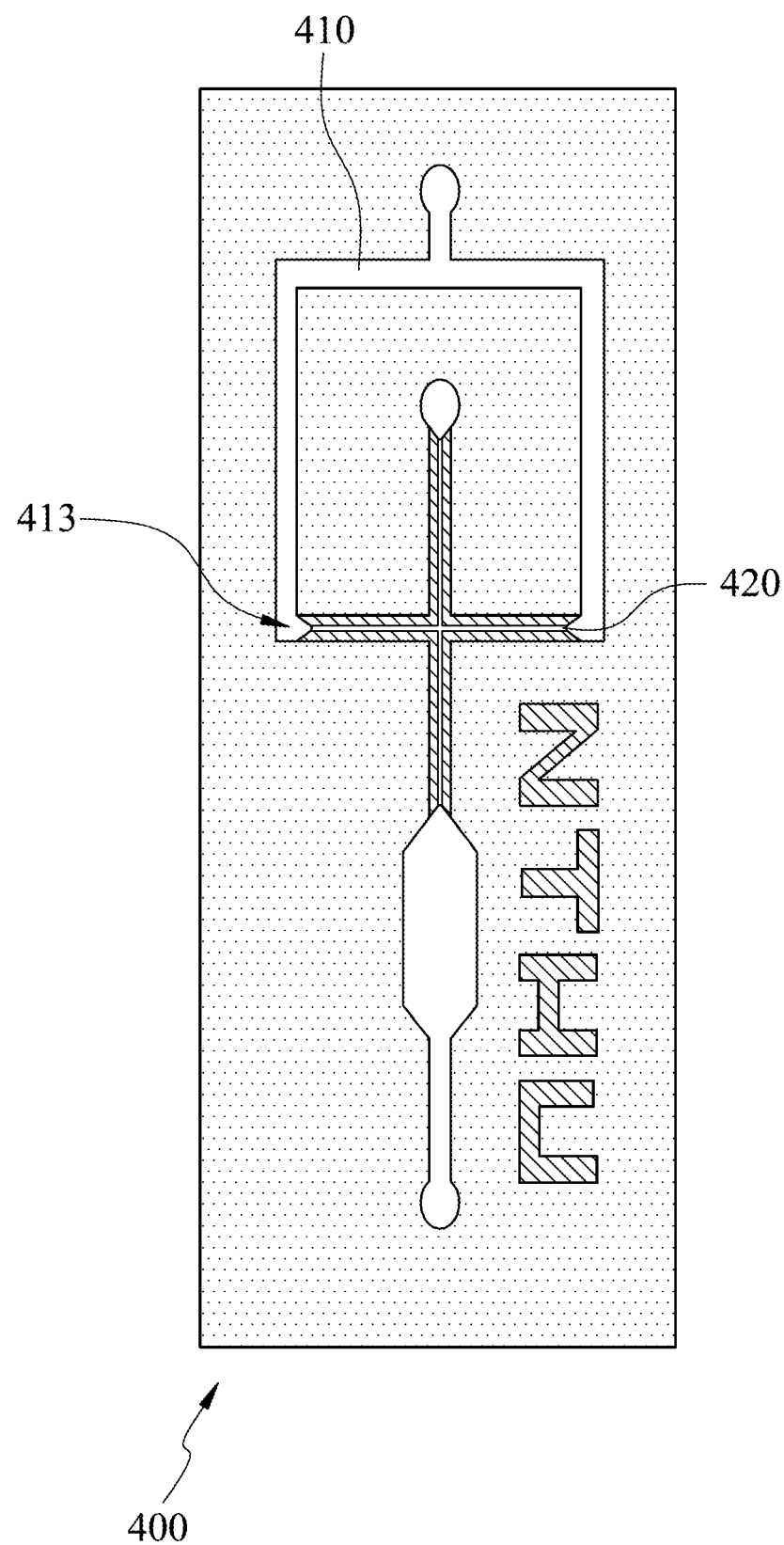

FIG. 6A to FIG. 6C are schematic views showing a method for fabricating microfluidic structures 400 according to another embodiment of the present disclosure. In FIG. 5, the microfluidic structure 300 is composed of the first microfluidic channel 310 with larger line-width and the second microfluidic channel 320 with smaller line-width. Therefore, to correctly align and combine two microfluidic channels with different line-width is a critical problem. In FIG. 6C, the microfluidic structure 400 includes a first microfluidic channel 410 with larger line-width and a second microfluidic channel 420 with smaller line-width. The first microfluidic channel 410 is formed by cutting the belt 411. The second microfluidic channel 420 is patterned by a photolithography process or a screen printing process, thus a pattern 422 is formed on the substrate 421. An aligning area 412 is formed on a portion of the belt 411 where the first microfluidic channel 410 located. The aligning area 412 includes an indentation 412a. An aligning mark 423 is formed on the substrate 421. A position of the aligning mark 423 is corresponded to a position of the aligning area 412. While the first microfluidic channel 410 is adhered with the second microfluidic channel 420, the aligning mark 423 that projects the substrate 421 is aligned to the indentation 412a. Therefore, the pattern 422 can be precisely embedded into an accommodating space 413, and the microfluidic structure 400 is formed.

From FIG. 6A to FIG. 6C, an easy and rapid method for fabricating the microfluidic structure 400 is provided. In one example, in a situation that without any supporting tools (e.g. microscope), the first microfluidic channel 410 and the second microfluidic channel 420 can be rapidly adhered with each other only by hand in accordance with the aligning mark 423. Furthermore, the aligning error can be less than 50 µm.

Figure 7A:
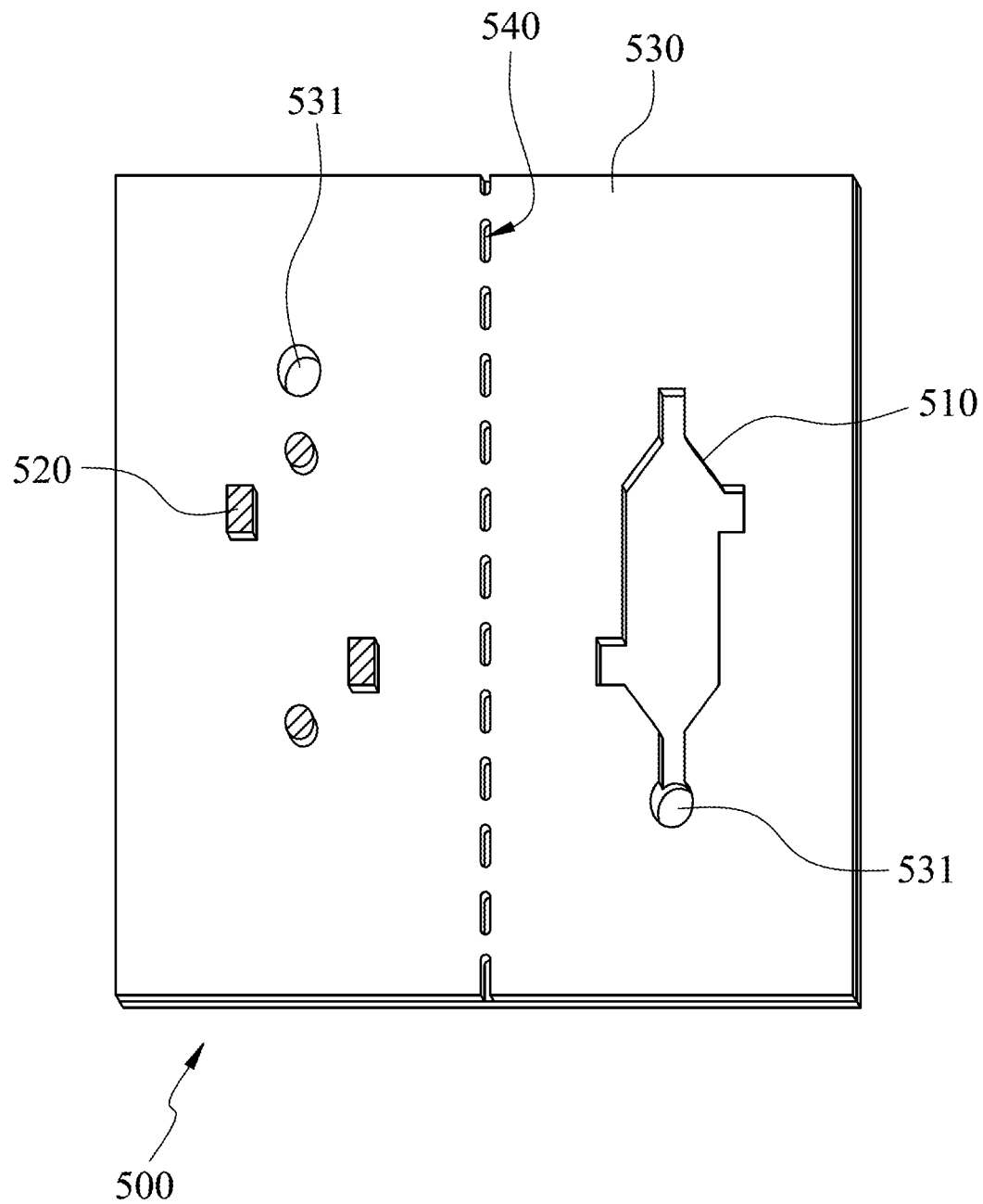
FIG. 7A is a schematic view showing a method for fabricating microfluidic structures according to still another embodiment of the present disclosure.
Figure 7B:
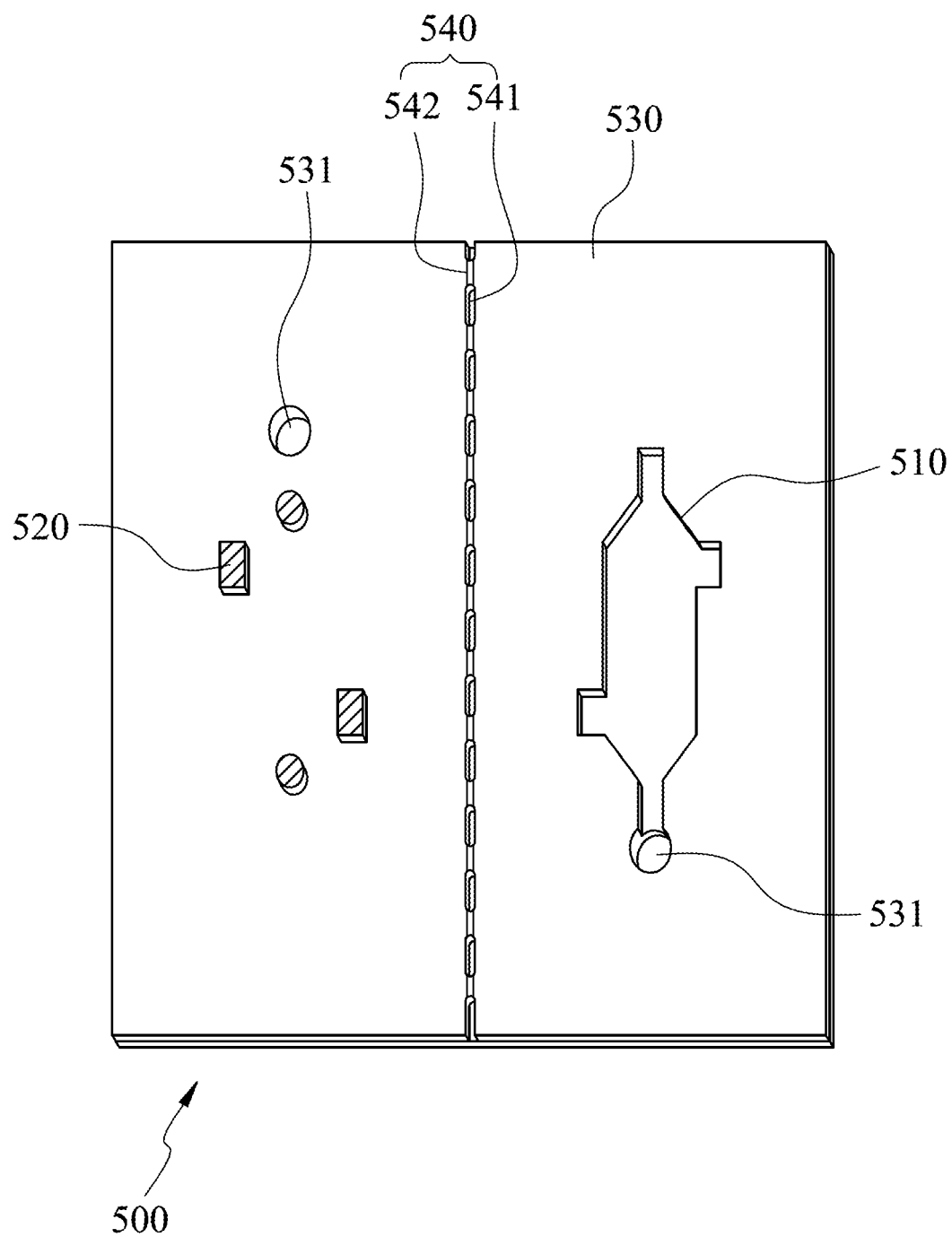
FIG. 7B is a schematic view showing another example of the folding line of FIG. 7A.

FIG. 7A is a schematic view showing a method for fabricating microfluidic structures 500 according to still another embodiment of the present disclosure; and FIG. 7B is a schematic view showing another example of the folding line 540 of FIG. 7A. In FIG. 7A, a belt 530 is cut into two portions, a microfluidic channel 510 and an aligning mark 520. The belt 530 is a double-sided tape. The structure of the belt 530 is similar to the belt 220 in FIG. 2. The aligning mark 520 and the microfluidic channel 510 are formed by cutting a protection layer (not shown) and an adhesion layer (not shown) of the belt 530. A hole 531 is formed by cutting through the belt 530 for injecting a fluid. After the microfluidic channel 510 and the aligning mark 520 are formed, a complete microfluidic structure 500 can be formed by aligning and folding the microfluidic channel 510 and the aligning mark 520. In addition to that the aligning mark 520 can be embedded into the microfluidic channel 510; a folding line 540 is also formed when cutting the belt 530. By a positioning functionality of the folding line 540, the aligning mark 520 and the microfluidic channel 510 can be precisely folded and adhered. Therefore, the stacking error can be reduced.

In FIGS. 7A and 7B, it is showed that by the folding line 540, the aligning mark 520 and the microfluidic channel 510 can be rapidly and precisely aligned without any supporting tools (e.g. microscope). For example, the microfluidic structure 500 can be formed by hand within 5 sec. Furthermore, by the folding line 540, the stacking error can be less than 1 µm. In FIG. 6A to FIG. 6C, only the aligning mark 423 is utilized for stacking and forming microfluidic structure 400. In FIG. 7A and FIG. 7B, by utilizing the folding line 540, the precision of alignment can be further enhanced, and stacking error can be reduced.

Furthermore, the folding line 540 can include an indentation 541 and a connecting portion 542. In FIG. 7B, a length of the connecting portion 542 can be less than 1 mm, and a thickness of the connecting portion can be two times than that of the belt 530. Therefore, when stacking and adhering the aligning mark 520 and microfluidic channel 510, by the specially designed folding line 540, the precision of alignment is higher while it is only performed by hand. In one example, two microfluidic channels with different line-width can be formed on two portion of belt 530 which is divided by the folding line 540. By utilizing the aligning mark 520 and the folding line 540, the two microfluidic channels with different line-width can be stacked for forming a complete microfluidic structure.

Figure 8:
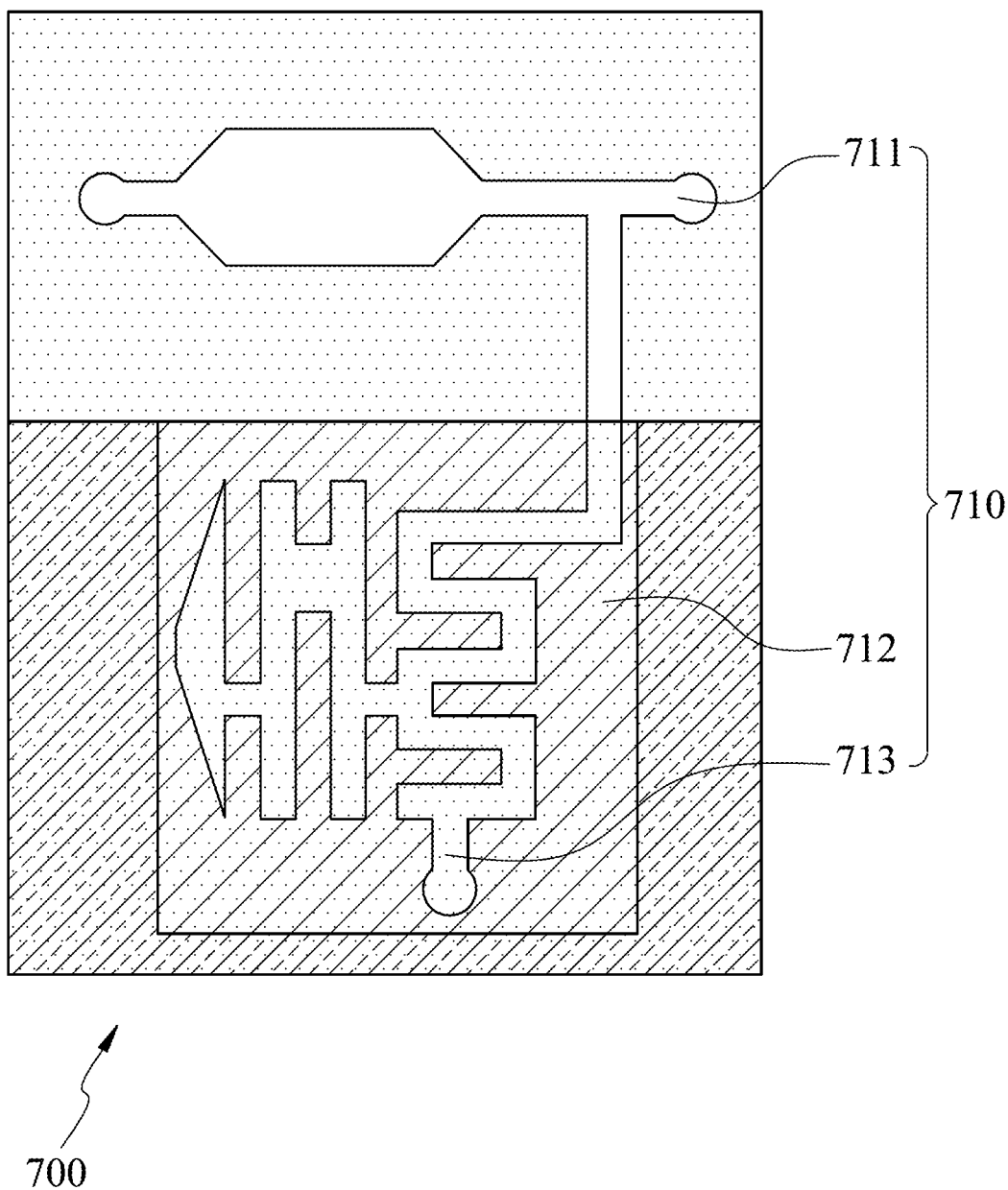
FIG. 8 is a schematic view showing a method for fabricating microfluidic structures according to further another embodiment of the present disclosure.

FIG. 8 is a schematic view showing a method for fabricating microfluidic structures 700 according to further another embodiment of the present disclosure. In FIG. 8, a belt 710 is cut and includes a first portion 711, a second portion 712 and a third portion 713. The first portion 711 is cut through, the second portion 712 is only cut off the protection layer 712, and the third portion 712 is cut off the protection layer and the adhesion layer. Therefore, the microfluidic structure 700 can be easily formed, and the alignment procedure can be performed under a small line-width structure.

Figure 9:
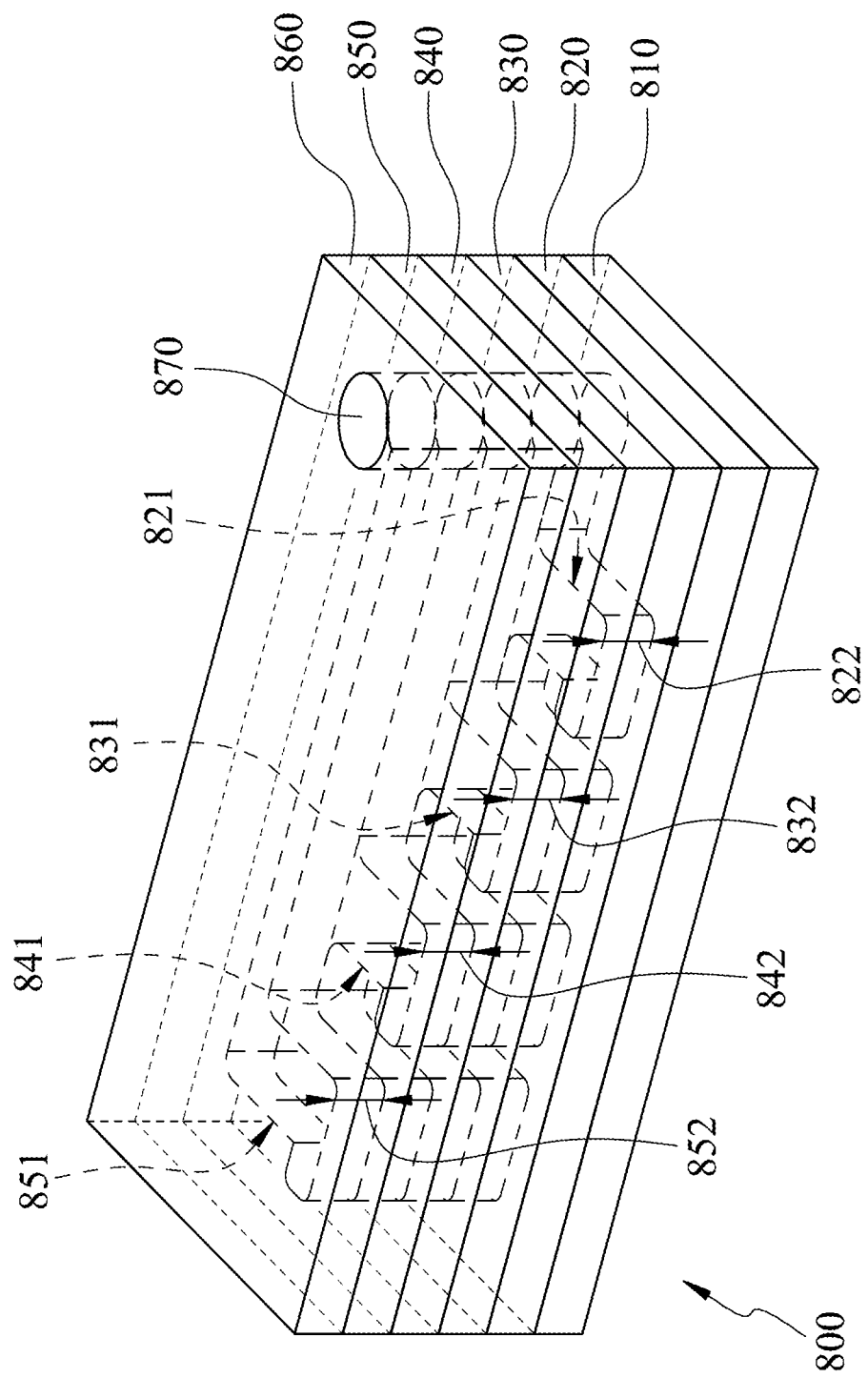
FIG. 9 is a schematic view showing a method for fabricating microfluidic structures according to one embodiment of the present disclosure.

FIG. 9 is a schematic view showing a method for fabricating microfluidic structures 800 according to one embodiment of the present disclosure. In FIG. 9, the microfluidic structure 800 is formed by stacking a first belt 820, a second belt 830, a third belt 840 and a fourth belt 850. The first belt 820, the second belt 830, the third belt 840 and the fourth belt 850 are a double-side tape or a single-sided tape respectively. A first microfluidic channel 821, a second microfluidic channel 831, a third microfluidic channel 841 and a fourth microfluidic channel 851 are formed in order on the first belt 820 to the fourth belt 850 respectively via cutting by a knife mold. The first microfluidic channel 821 has a first depth 822, the second microfluidic channel 831 has a second depth 832, the third microfluidic channel 841 has a third depth 842, and the fourth microfluidic channel 851 has a fourth depth 852. The first depth 822, the second depth 832, the third depth 842 and the fourth depth 852 can be the same or different. For example, the first depth 822, the second depth 832, the third depth 842 and the fourth depth 852 can be respectively adjustable between 30 µm to 400 µm. Therefore, microfluidic channels with various depths can be formed in the microfluidic structure 800 by stacking the first microfluidic channel 821 to the fourth microfluidic channel 851. In FIG. 9, a fluid can have at least three degree of flow in the microfluidic structure 800, thus the application field can be extended. The microfluidic structure 800 is made by double-sided tapes or single-sided tapes; therefore it is easy to adhere a substrate 810 on a bottom side of the first belt 820 and another substrate 860 on a top side of the fourth belt 850. A hole 870 is formed on the substrate 860 and connected with each microfluidic channel for injecting the fluid.

To sum up, an easy and rapid method for fabrication microfluidic structures is provided in the present disclosure. By cutting a belt having adhesion layers (e.g. double-sided tape), the microfluidic structure can be formed directly on the belt, and a complete microfluidic device can be formed via the adhesion layers. Therefore, the whole process has advantages on simple materials, rapid fabricating process and low cost. The method for fabricating microfluidic structures of the present disclosure can solve issues on the complicated fabricating process for the conventional microfluidic structure, and is especially suitable for biomedical applications, such as extraction of proteins or stem cells.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method for fabricating microfluidic structures, comprising:
   providing a first belt and forming an adhesion layer on at least one surface of the first belt;
   cutting the first belt for forming a first microfluidic channel, wherein the first microfluidic channel comprises a first depth;
   providing a second belt and forming an adhesion layer on at least one surface of the second belt;
   cutting the second belt for forming a second microfluidic channel, wherein the second microfluidic channel comprises a second depth;
   adhering the first belt and the second belt via the adhesion layer of the first belt and the adhesion layer of the second belt; and
   stacking the first belt and the second belt in order to stack the first depth and the second depth.

2. The method of claim 1, wherein the first depth is different from the second depth.

3. The method of claim 1, wherein the first depth or the second depth is ranged from 30 μm to 400 μm respectively.

* * * * *